United States Patent
Fathimulla et al.

(10) Patent No.: US 7,605,357 B2
(45) Date of Patent: Oct. 20, 2009

(54) PHOTON COUNTING OPTICALLY PREAMPLIFIED PHOTORECEIVERS WITH MICRO-DIGITIZED PIXELS

(75) Inventors: Ayub Mohammed Fathimulla, Forest Hill, MD (US); Olaleye Adetoro Aina, Columbia, MD (US); Harry Stephen Hier, Sykesville, MD (US)

(73) Assignee: Epitaxial Technologies, Baltimore, MD (US)

( * ) Notice: Subject to any disclaimer, the term of this patent is extended or adjusted under 35 U.S.C. 154(b) by 672 days.

(21) Appl. No.: 11/384,909

(22) Filed: Mar. 21, 2006

(65) Prior Publication Data

US 2007/0221827 A1    Sep. 27, 2007

(51) Int. Cl.
 *H01J 40/14*    (2006.01)
(52) U.S. Cl. .................... 250/214 R; 250/214.1
(58) Field of Classification Search ............. 250/214 R, 250/214.1, 207, 208.1; 257/186, 438, 440
See application file for complete search history.

(56) References Cited

U.S. PATENT DOCUMENTS 6,720,588 B2 *    4/2004    Vickers .................. 257/186

* cited by examiner

*Primary Examiner*—Que T Le
(74) *Attorney, Agent, or Firm*—H. C. Lin, Patent Agent

(57) ABSTRACT

An array of photon counting phototoreceivers is constructed as an imager with micro-digitized pixels. Each photoreciever comprises a vertical cavity optical amplifier (VCSOA) as an optical amplifier, an avalanche photodiode as detector and an analog-to-digital converter (ADC) in an integrated structure. The ADC serves as a 1-bit digitizer and uses a resonant tunneling bipolar transistor RTBT. While the preferred embodiment of the invention have been described, it will be apparent to those skilled in the art that various modifications may be made to the embodiments without departing from the spirit of the present invention. Such modifications are all within the scope of the present invention.

10 Claims, 8 Drawing Sheets

PHOTON COUNTING OPTICALLY PREAMPLIFIED PHOTORECEIVERS WITH MICRO-DIGITIZED PIXELS

BACKGROUND OF THE INVENTION

1. Field of Invention

The invention relates to compact, low-cost, low power micro digitized pixel photodetector arrays with true photon counting capabilities. The proposed detector arrays, which are not commercially available, are based on low noise avalanche photodiode (APD) arrays with micro digitization, built-in optical pre-amplification and internal multiplication gain that enable photon counting in a semiconductor array.

2. Brief Description of Related Art

To date, photomultiplier tube (PMT) devices have been used for photon counting, however this is not a semiconductor approach that can be used for large format arrays. Moreover their reliability is poor, they are susceptible to magnetic fields and require high voltage power supplies. Currently, the semiconductor approach uses avalanche photodiode (APD) arrays, which have low gain with high excess noise and can only be operated for photon counting in the Geiger-mode.

For larger format arrays, which are necessary for enhanced spatial resolution, semiconductor approaches with their capability for monolithic integration and high volume, low cost production are necessary. However, the most common semiconductor approaches using positive-intrinsic-negative (PIN) diodes and avalanche photodiodes (APDs) are not suitable for photon counting applications. First, PIN diodes have either no optical or internal gain. Secondly, APDs have low internal gains (10-100) in the linear mode (i.e. below the breakdown voltage) and only marginally high (100-1000) in the non-linear mode (the so-called Geiger mode above the breakdown voltage). For true photon counting, the gain must be sufficiently high and constant so that the output signal produced by one photon can usually be distinguished from the dark noise. This means that the gain has to be greater than 10,000 in the steady state in order for the probability of detection to be greater than 70%.

In the Geiger-mode, APDs are often used as photon counting detectors by biasing them above the breakdown voltage where any incoming photon triggers an avalanche pulse whose pulse-width can be extremely long unless it is limited by external high resistance networks (passive quenching) or active quenching circuits. This need to quench Geiger-mode APDs limits the minimum pulse width to greater than 16 ns for passive quenching or to 8 ns for active quenching; a limitation which makes them unsuitable for the applications in which pulse width less than 1 ns is critical. In addition, because Geiger-mode APDs perform photon counting in a gated, nonlinear regime, they are susceptible to timing jitter and have limited dynamic range.

Implementation of this invention would result in a breakthrough in true photon counting semiconductor optical receivers for use in the next generation defense and commercial applications. They include: ladar, free space optical communications, position sensitive sensors, quantum encryption and computing, biomedical applications, metrology, bioluminescence and single molecule fluorescence microscopy, IR spectroscopy and photon correlation spectroscopy

SUMMARY OF THE INVENTION

This invention deals with photoreceiver arrays consisting of micro-digitized pixels of APDs with built-in optical pre-amplification having true photon counting capabilities and ultra high sensitivities. To achieve the true photon counting capabilities requires the following objectives:

Optimized APD devices to achieve multiplication gains greater than 100 below the breakdown voltage and dark currents lower than 0.1 nA for nanosecond pulse widths.

Implementation of low noise vertical cavity semiconductor optical amplifier (VCSOA) as disclosed in U.S. Pat. No. 6,987,306, with optical gain up to 30 dB and noise figure less than 5 dB.

Implementation of at least 6-bit digitizer based on novel resonant tunneling bipolar transistor RTBT technology or other technologies.

Monolithic integration of all the above components into photoreceiver arrays

Current semiconductor approaches use avalanche photodiode (APD) arrays, which have low gain with high excess noise and can only be operated for photon counting only in the Geiger-mode at low bandwidth because of the need to quench the received pulses with slow external circuits. APD Geiger-mode photon counting receivers cannot be used for sub-nanosecond photon counting. Based on limitations of APDs, namely the insufficiently high sensitivity of linear detectors and the inability to use them in a true photon counting mode, in this invention we propose an optically preamplified APD photodetector that has both optical gain sufficiently high combined with avalanche multiplication gain to enable true photon counting and ultra high sensitivity. Our proposed solution is to apply optical amplification techniques to increase the signal strength with minimal noise amplification. As shown in FIG. 1, the notional semiconductor photon counting photoreceiver will be capable of photon counting probability higher than 90% with the designed optical amplifier and the APD operating in the linear mode with only modest multiplication gains. When the three components are integrated, cascaded gains will be as high as 112,000 below the breakdown voltage, well in excess of the required gain for linear photon counting. This corresponds to a single photon sensitivity of 0.25 nW (−65.8 dBm) or $8\times10^{-15}$ $W/H^{1/2}$ for nanosecond pulse widths. This concept can also be applied to develop ultra-high sensitivity optical receivers and arrays: the key component for the ladar and free-space laser communication that will provide extra system margin, reduce the transmitter requirements and extend the range, resolution and link margin.

DETAILED DESCRIPTION OF THE INVENTION

Figure 1:
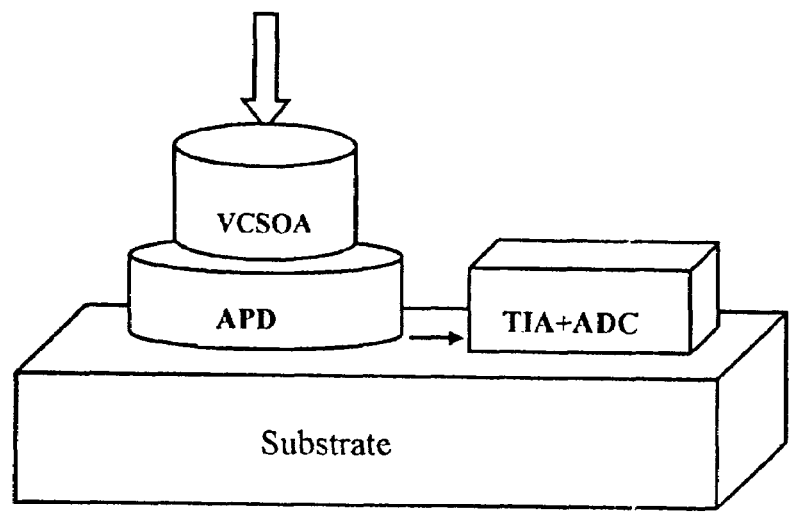
FIG. 1 shows the sketch of monolithic integrated photon counting photoreceiver concept.

This invention deals with photoreceiver array based on semiconductor technology that is capable of true single photon counting at 2.5 Giga samples/sec or higher bit rate. In our earlier patent, as disclosed in U.S. Pat. No. 6,987,306, we established the feasibility of using integrated APD/VCSOA to achieve high sensitivity photoreceivers and arrays. A notional sketch of the photon counting microdigitized photoreceiver is shown in FIG. 1. When all the components are integrated it will have sufficient photoelectric gain (>10,000) in the linear mode to achieve true single photon counting. The parameters of the photoreceiver components that are required to be optimized are the optical amplifier gain and the APD gain and dark current.

Photoreceiver Concept and Block Diagram

The overall concept of our proposed photoreceiver is to monolithically integrate VCSOAs, APDs, buffer amplifier and micro-digitization at pixel level to achieve sufficiently high gains for true single photon counting. FIG. 1 illustrates this approach. An incident single photon is amplified by the VCSOA by up to 1000-fold (30 dB gain). The VCSOA has built-in distributed Bragg reflectors (DBR) as input and output bandpass filters to remove the noise photons due to amplified spontaneous emission (ASE) and other noise sources. The noise figure of a typical VCSOA is typically 6 dB for a gain of 30 dB. Therefore, in addition to the 1000 photons generated by the VCSOA in response to the incident single photon, 4 noise photons are also generated. These photons are then passed on to the APD where they are converted into photoelectrons by avalanche multiplication. The avalanche multiplication gain can be as high as 100 in the linear mode (below the breakdown voltage) and as high as several thousands above the breakdown voltage in the so-called Geiger-mode. Because of the limited avalanche gain of APDs below the breakdown voltage, APDs can only be used for photon counting above the breakdown voltage (i.e. in the Geiger-mode). However, above the breakdown voltage, photogenerated avalanche electrons continue to flow and this requires complex external circuits to quench the current, which considerably reduces the bandwidth of the photoreceiver. With our proposed photoreceivers, the overall photoreceiver gain can be sufficiently high (up to 100,000 as with photomultipliers) that the APD can be operated in the linear mode and external quenching circuits are not needed.

Figure 2:
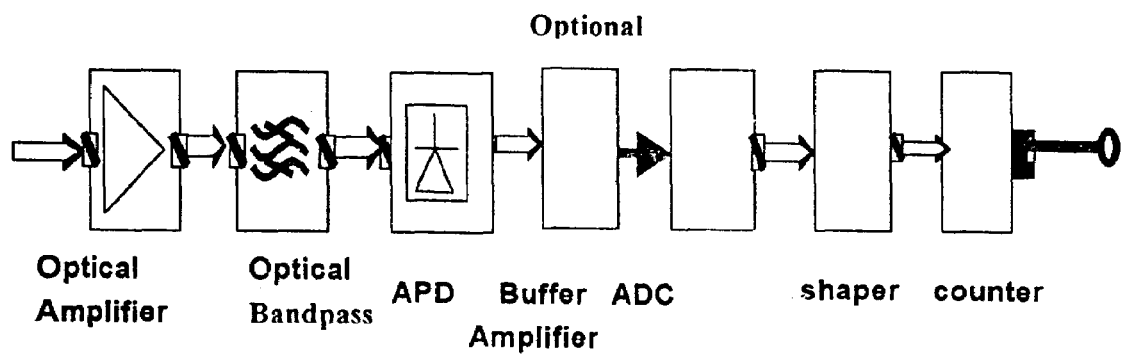
FIG. 2 shows the photon counting VCSOA/APD photoreciever block diagram.

The block diagram of the photoreceiver is shown in FIG. 2. The first three blocks are integrated in the proposed array as a single chip. The shaper and the counter can be a part of the read out integrated circuit ROIC. The VCSOA has an integral optical bandpass filter which serves to minimize amplified spontaneous emission from the optical amplifier or any other noise outside its bandpass.

Noise & Photon Counting Model

The basic requirements for a single photon counting photoreceiver is that the photoelectric gain should be sufficiently high to overcome any signal due to noise electrons introduced by the photoreceiver and associated electronic components. The photon counting probability of a photoreceiver can be expressed by the probability of a single photon generated electron, which is given by:

$$f = \exp\left(\frac{1-5\sigma}{g-\frac{1}{2}}\right) \quad (1)$$

where g is the overall gain and 5σ is the noise threshold above which there is detection. To fully evaluate equation 1, one must develop a noise model. The principal noise sources used for the model are ASE noise from the optical amplifier, noise from dark current in the APD, excess noise from the APD due to the avalanche multiplication processes and Johnson noise from the buffer amplifier, ADC and any other downstream electronics.

Figure 3:
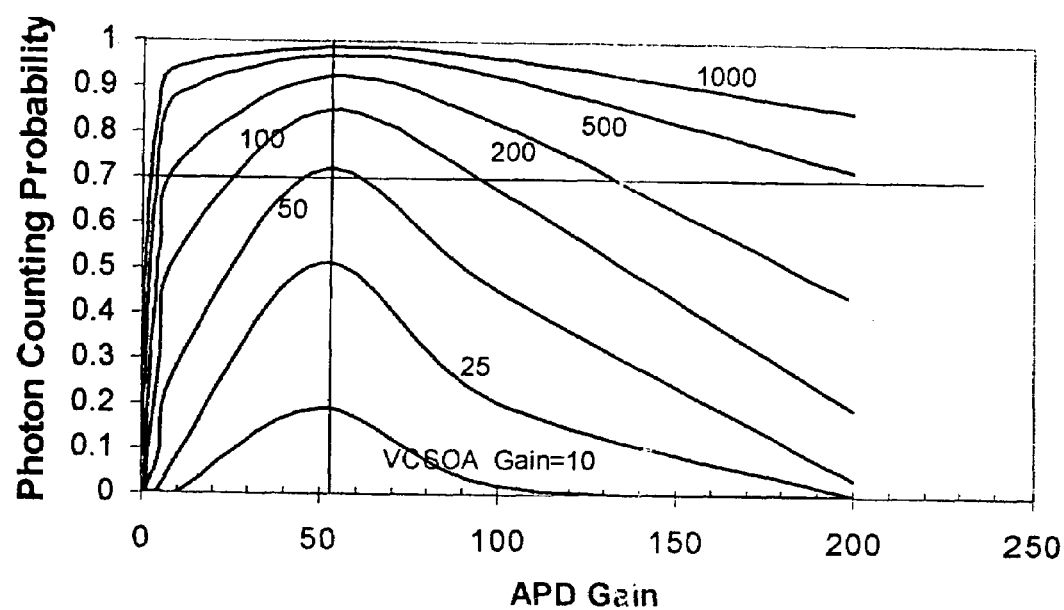
FIG. 3 shows the photon counting probability-vs-optical and multiplication gain
Figure 4:
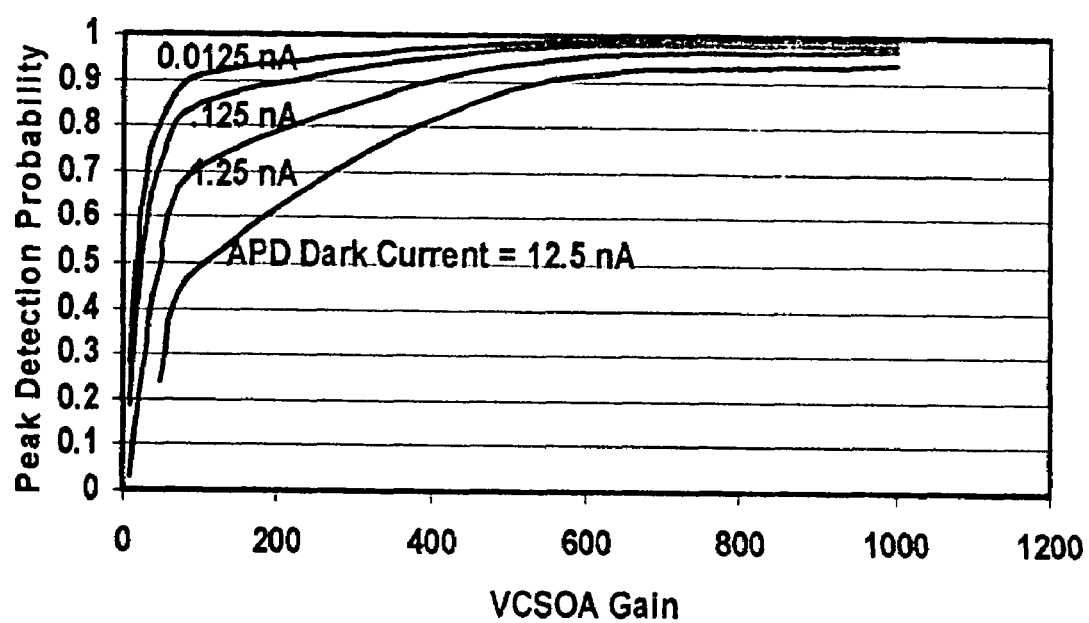
FIG. 4 shows the peak detection probability-vs-optical gain and dark current

The photon counting probability estimated using the noise model is plotted in FIG. 3 as a function of optical amplifier and APD gain. For true photon counting, the probability must be close to 1, i.e. >0.95. This condition is met at low gain for the APD and medium to high gain for the VCSOA. This approach allows the APD to be designed for low gain (linear range below breakdown) in order to be able to maximize other parameters such as the dark current and noise. Therefore, the proposed photon counting photoreceivers will not require external quenching circuits. Further analysis using the noise model shows that the APD dark current not only reduces the peak photon counting probability, but it also affects the minimum APD gain. FIG. 4 shows the peak VCSOA/APD photon counting probability as a function of VCSOA gain and dark current. By improving the APD performance or by cooling the photoreceiver to 230K and reducing the dark current by two orders of magnitude, true single photon counting can be done with the proposed photoreceiver with APD and VCSOA gains as low as 100.

Digitizer Circuits Using RTBT Technology

Figure 5:
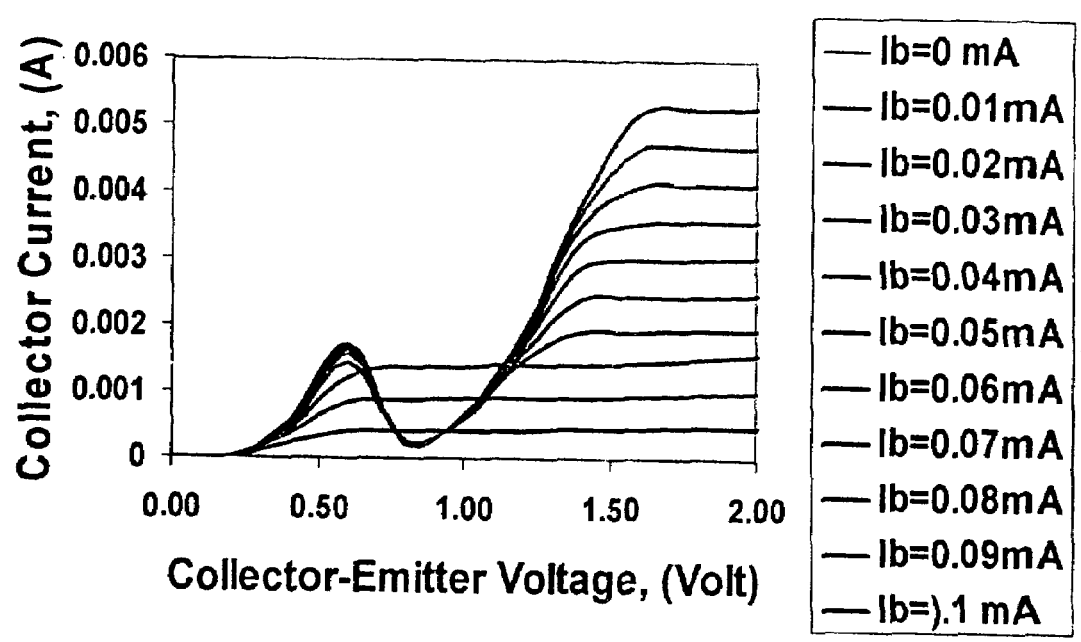
FIG. 5 shows a typical RTBT circuit diagram, material structure and I-V characteristics.
Figure 5:
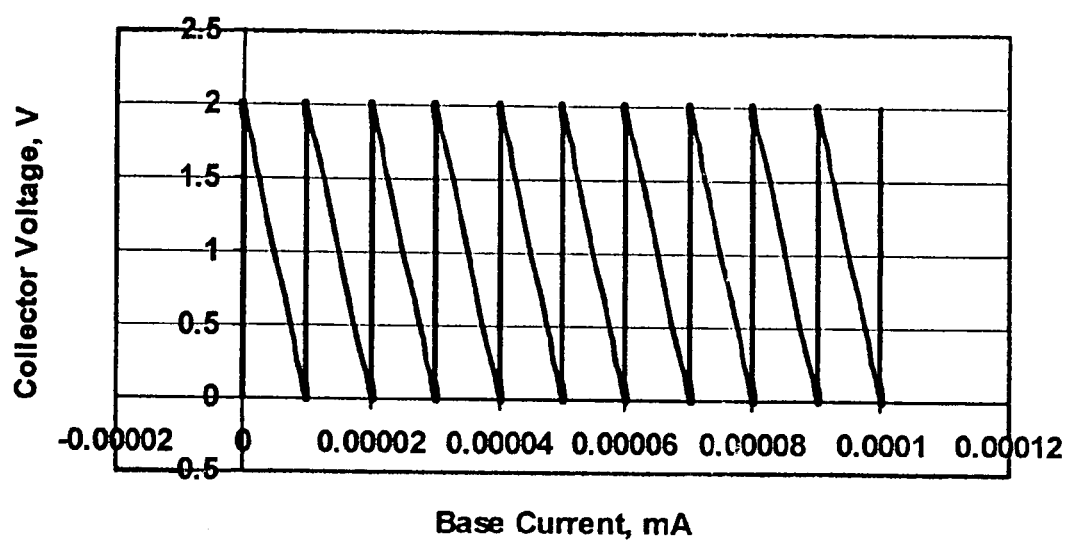

In the proposed invention the analog-to-digital converters with sampling rates exceeding of 2.5 Gbps can be integrated with each pixel. For the design of the high-speed ADC, our approach will be to exploit the unique I-V characteristic of the RTBT shown in FIG. 5, in which the negative resistance is due to the RTD in the emitter of the HBT. The RTBT also has folding I-V characteristics due to multiple tunneling in the collector-base operation of the device. When used to implement comparators, this folding characteristic reduces the number of transistors needed for the comparator by a factor of $2^n-1$, where n is the number of peaks and valleys. For a device with at least 4 peaks and valleys, the number of transistors in the comparator is reduced by a factor of 15. This part count reduction is critical for the success of the digitized pixel approach and for not having a drastically reduced fill-factor because of the integrated digitizer. Therefore, the RTBT disclosed in U.S. Pat. No. 6,987,306 enables maximum fill-factors for the microdigitized pixels. The key parameters for the RTBT with regard to its ADC applications are the PVR, peak current to valley current ratio. A large PVR is needed for large voltage swings, while low peak voltage and currents are required to minimize the power dissipation per pixel. The RTBT can be used to produce photodiodes and HBT amplifiers as well as resonant tunneling diodes for ADC, oscillators and switches. It is ideal for single-chip integration of these circuits. As such, it provides the best trade-off between current, gain and negative resistance. The microdigitizer can also be conceived using HBT or HEMT based technologies.

Figure 6:
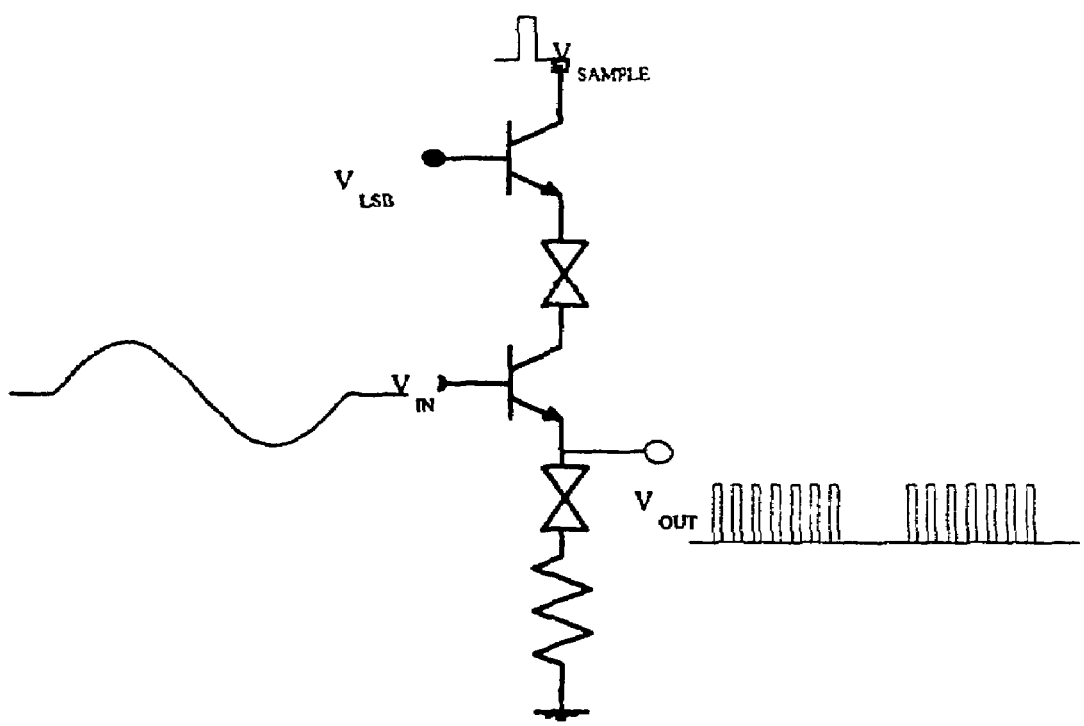
FIG. 6 shows the schematic of a notional 1-bit digitizer circuit using RTBT

The high speed digitizers that can be integrated with the pixel is given here. This approach is made possible by two attributes of our proposed photon counting technology. One is the fact that the combined gain of the proposed VCSOA/APD enables a single photon (2.6 nW in 1 nS) to generate a micro-ampere current pulse at the input to the microdigitizer (as compared to a nanoampere with a standard APD). This current level is within the range of required base currents for the device technology, which will be used to implement the digitizer. Therefore, the VCSOA/APD can be connected directly to the digitizer without the need for an intervening amplifier. The second is the fact that the folding characteristic of the RTD reduces the number of transistors needed for the comparator. For example, a 1-bit digitizer using conventional technology requires at least 20 circuit elements (including transistors. With our approach only 4 circuit elements are required. These elements are two resonant tunneling bipolar transistors (RTBT) and two resistive elements. FIG. 6 shows a schematic of the 1-bit digitizer circuit that can be integrated with each APD-VCSOA pixel. The circuit is essentially a comparator, which compares the input signal $V_{IN}$ with the least significant bit, $V_{LSB}$, which would be typically half of the maximum expected signal. It generates a digital "1" when $V_{IN}$ is greater than $V_{LSB}$ and the sampling pulse, $V_{SAMPLE}$ is on, otherwise it generates a "0". The result is a bit stream that represents when the received signal is larger than a preset threshold.

Photoreceiver Arrays

Figure 7A:
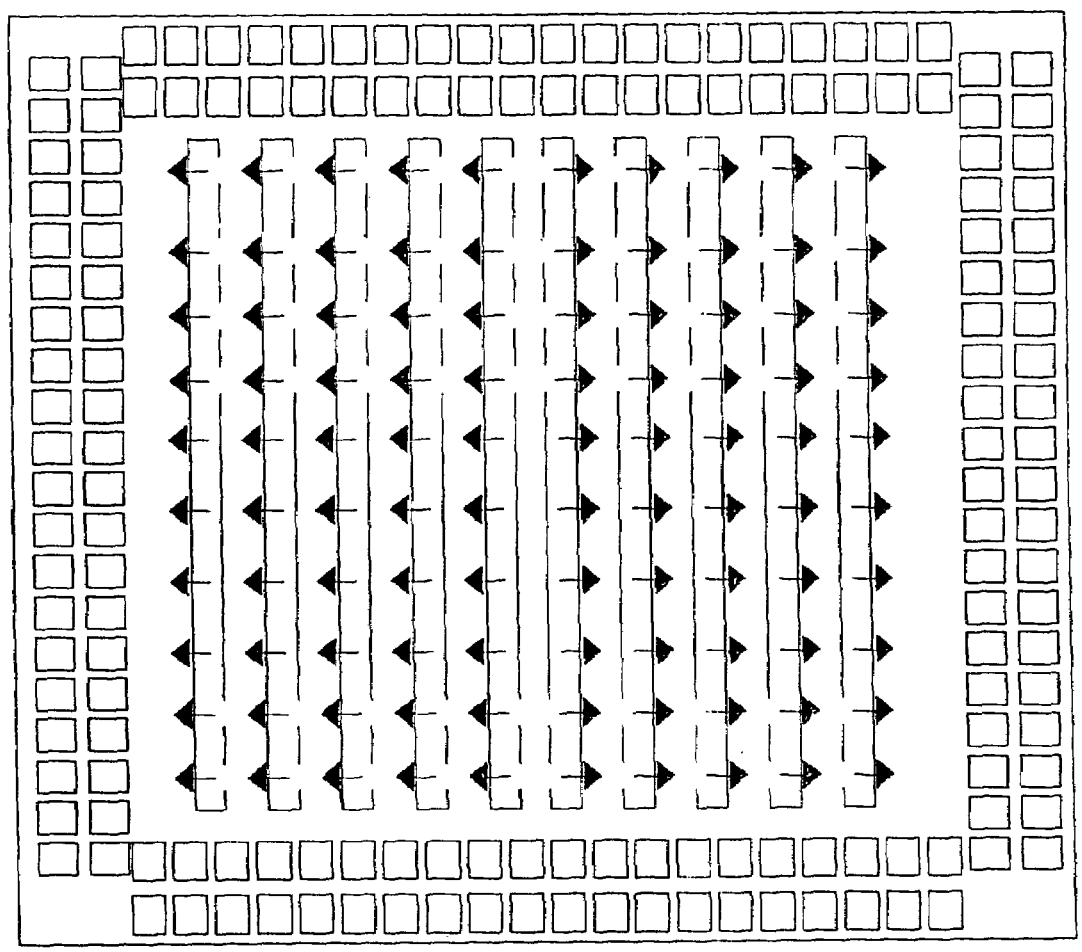
FIG. 7 notional VCSOA/APD array configuration
Figure 7B:
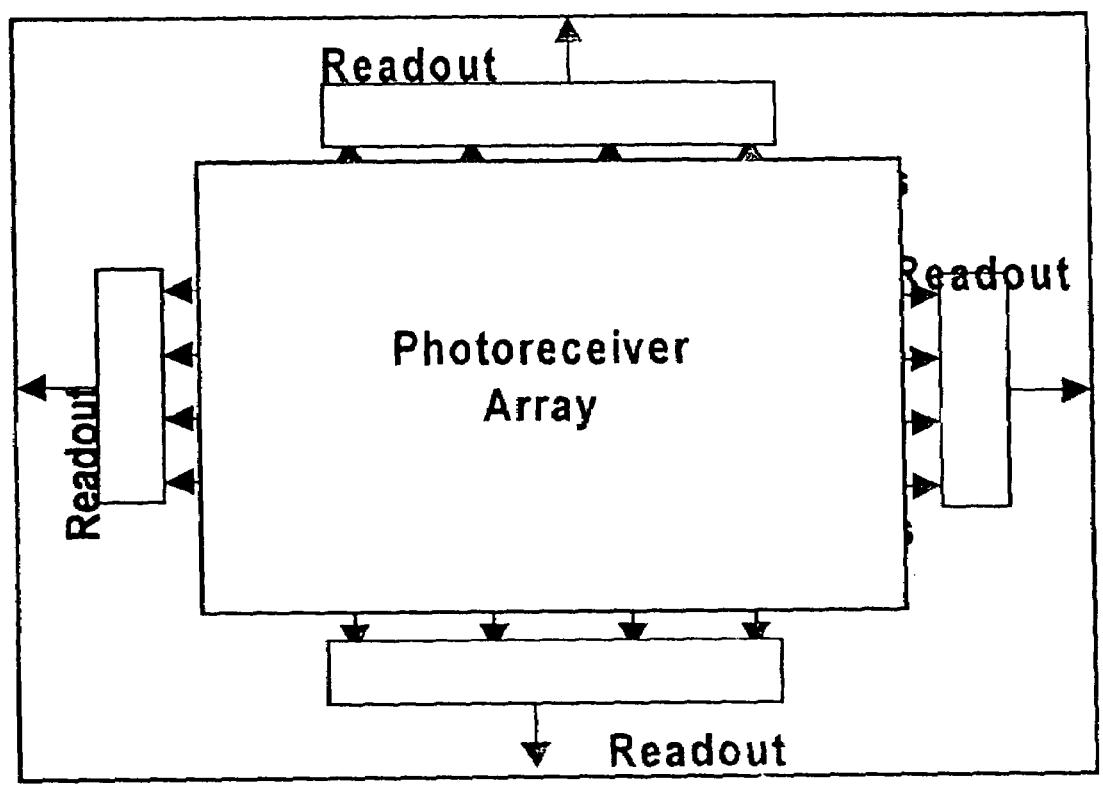

The photoreceiver array will consist only of the VCSOA/APD and the microdigitizer in each pixel. Since the output of the micro-digitizer is either a "1" (0.5 to 5 V) or a "0" (0 V), it can be connected directly to bond pads for direct interconnect with high pin-count packages. FIG. 7 illustrates a notional array design for this type of array configuration which is possible because the combined gain of the VCSOA/APD enable a single photon (2.6 nW in 1 nS) to generate a microampere current pulse at the input to the micro-digitizer (as compared to a nanoampere with a standard APD). Microampere current levels are within the range of required base currents for the RTBT technology. If a buffer amplifier is required between the VCSOA/APD and ADC, the HBT part of the RTBT can be used to design the amplifier. Further, the arrays of optically preamplified photoreceivers with microdigitized pixels can be bump bonded to other circuits enabling higher fill-factors. The proposed invention on photon counting optically preamplified photoreceivers with micro-digitized pixels uses InP based technology, the concept of can be extended to other wavelengths covering ultra violet to very long wavelength infrared using the InP, GaAs, GaSb, InAs, InSb, SiGe, SiC, Si, GaN etc. based technologies. The design of this photoreceiver can be expanded to other wavelengths to produce small, monolithic pixilated photon counting photoreceivers with a wide range of commercial and military applications.

The invention claimed is:

1. A photon counting photoreceiver, comprising:
    a vertical cavity semiconductor optical amplifier (VCSOA);
    an optical bandpass integrated with said VCSOA to filter amplified signals from said optical amplifier;
    an avalanche photodiode (APD) photodetector integrated with said VCSOA to detect filtered signals from said bandpass filter;
    an analog-to-digital converter (ADC) integrated with said VCSOA to convert detected signals from said photodetector;
    a shaper to limit digital signals from said ADC; and
    a counter for photon counting limited signals from said shaper.

2. The photon counting photoreceiver as described in claim 1, wherein said VCSOA, APD, digital converters and buffer amplifier are monolithically integrated on a single wafer.

3. The photon counting photoreceiver as described in claim 1, wherein said digital converters is selected from the group consisting of RTBT, HBT, HEMT, and CMOS based technologies.

4. The photon counting photoreceiver as described in claim 1, wherein said avalanche photodiode is selected from the group consisting of a resonant cavity avalanche photodiode, separate absorption, and multiplication regions (SAM), separate absorption, charge and multiplication (SACM) impact-ionization engineered multiplication region ($I^2E$), resonant cavity, resonant cavity separate absorption, charge and multiplication (RC-SACM) and wave guide APDs (WGAPD).

5. The photon counting photoreceiver as described in claim 1, wherein said ADC is selected from the group consisting of a one-bit, 6-bit, 8-bit and 12 bit digitizer.

6. The photon counting photoreceiver as described in claim 5, wherein said digitizer uses a resonant tunneling bipolar transistor (RTBT).

7. The photon counting photoreceiver as described in claim 6, wherein said RTBT comprises a hetero-junction bipolar transistor (HBT) and a resonant tunneling diode (RTD).

8. The photon counting photoreceiver as described in claim 6, wherein said RTBT comprises successive layers of $N^+$ HBT subcollector, N HBT collector, $P^+$ HBT base, N HBT emitter, $N^+$ RTD emitter, barrier, well, barrier, and $N^+$ RTD collector.

9. The photon counting photoreceiver as described in claim 1, wherein each said photoreceiver forms a pixel of an imaging array.

10. The photon counting photoreceiver as described in claim 1, wherein said photoreceiver is extensible to wavelengths covering ultra violet to very long wavelength infrared using semiconductor material selected from the group consisting of InP, GaAs, GaSb, InAs, InSb, Si, SiGe, SiC and GaN.

* * * * *